(12) United States Patent
Chen et al.

(10) Patent No.: US 11,043,788 B2
(45) Date of Patent: Jun. 22, 2021

(54) DARK CAVITY LASER

(71) Applicant: WENZHOU COLLABORATIVE INNOVATION CENTER OF LASER AND OPTOELECTRONICS, Beijing (CN)

(72) Inventors: Jingbiao Chen, Beijing (CN); Tiantian Shi, Beijing (CN)

(73) Assignee: WENZHOU COLLABORATIVE INNOVATION CENTER OF LASER AND OPTOELECTRONICS, Beijing (CN)

(*) Notice: Subject to any disclaimer, the term of this patent is extended or adjusted under 35 U.S.C. 154(b) by 105 days.

(21) Appl. No.: 16/579,653

(22) Filed: Sep. 23, 2019

(65) Prior Publication Data

US 2021/0028595 A1    Jan. 28, 2021

(30) Foreign Application Priority Data

Jul. 25, 2019  (CN) .......................... 201910677386.2

(51) Int. Cl.
*H01S 3/223* (2006.01)
*H01S 3/131* (2006.01)
(Continued)

(52) U.S. Cl.
CPC ........ *H01S 3/1317* (2013.01); *H01S 3/08054* (2013.01); *H01S 3/091* (2013.01);
(Continued)

(58) Field of Classification Search
CPC .. H01S 3/1317; H01S 3/1305; H01S 3/08054; H01S 3/223; H01S 3/136; H01S 3/091; H01S 3/1062; H01S 3/134
See application file for complete search history.

(56) References Cited

U.S. PATENT DOCUMENTS

| 2009/0296760 A1* | 12/2009 | Zhu | ........................... G04F 5/14 |
| | | | 372/32 |
| 2020/0185874 A1* | 6/2020 | Broderick | ............... H01S 3/105 |
| 2020/0194955 A1* | 6/2020 | Rotondaro | ............ H01S 3/0941 |

FOREIGN PATENT DOCUMENTS

| CN | 1689960 A | 11/2005 |
| CN | 101366152 A | 2/2009 |
| | (Continued) | |

OTHER PUBLICATIONS

English Translation of CN109270825A (Year: 2019).*
(Continued)

*Primary Examiner* — Yuanda Zhang
(74) *Attorney, Agent, or Firm* — J.C. Patents

(57) ABSTRACT

The present disclosure provides a dark cavity laser, including: a frequency stabilized laser output device configured to generate a laser light, and perform a frequency stabilized processing on the generated laser light to output it to the dark cavity laser device as a pump light of a gain medium of a dark cavity; and a dark cavity laser device including a main cavity, and a cavity of the main cavity is provided inside with a gas chamber of a gain medium of a dark cavity laser light, where the gain medium of the dark cavity laser light is alkali metal atoms; the dark cavity laser device is configured to receive the pump light, and form a polyatomic coherent stimulated radiation between transition levels of the alkali metal atoms in the gas chamber by a weak feedback of the main cavity to generate the dark cavity laser light.

10 Claims, 3 Drawing Sheets

(51) Int. Cl.
  *H01S 3/106* (2006.01)
  *H01S 3/091* (2006.01)
  *H01S 3/136* (2006.01)
  *H01S 3/08* (2006.01)
  *H01S 3/13* (2006.01)
  *H01S 3/134* (2006.01)

(52) U.S. Cl.
  CPC .......... *H01S 3/1062* (2013.01); *H01S 3/1305* (2013.01); *H01S 3/136* (2013.01); *H01S 3/223* (2013.01); *H01S 3/134* (2013.01)

(56) References Cited

FOREIGN PATENT DOCUMENTS

| CN | 102593694 A | 7/2012 |
|---|---|---|
| CN | 103256983 A | 8/2013 |
| CN | 103414470 A | 11/2013 |
| CN | 109270825 A | 1/2019 |
| EP | 2601514 A1 | 6/2013 |

OTHER PUBLICATIONS

"Dual-Wavelength Good—Bad-Cavity Laser System" IEEE Transactions on Ultrasonics, Ferroelectrics, and Frequency Control, vol. 65, No. 10, Oct. 2018.

"Experimental progress of dual-wavelength good-bad cavity active optical frequency standard", Journal of Time and Frequency vol. 41No. 3 Jul. 2018.

" 主动光钟的研究进展 ", Chin Sci Bull, 2015, 60: 1963-1975, doi: 10.1360/N972014-00865.

" 基于 _85_Rb_5S_1_2_省略_3_2_ 的小型超稳铷原子光频标 ", Journal of Time and Frequency, vol .41No. 3, Jul. 2018.

Office Action of the priority Chinese application No. 201910677386.2.

* cited by examiner

DARK CAVITY LASER

CROSS-REFERENCE TO RELATED APPLICATION

This application claims priority to Chinese Patent Application No. 201910677386.2, filed on Jul. 25, 2019, which is hereby incorporated by reference in its entirety.

TECHNICAL FIELD

The present disclosure relates to the field of laser technology, and more particularly, to a dark cavity laser.

BACKGROUND

As the most sophisticated scientific instrument and equipment capable of outputting quantum frequency standards, an atomic clock plays important roles when applied to the fields such as promoting redefinition of time second, satellite navigation and positioning, precision scientific measurement, and physical theory. In particular, based on superior accuracy and stability, an optical frequency atomic clock (optical clock) with optical frequency transition as a reference spectral line has become a research direction.

In the prior art, the optical clock is mostly based on traditional passive optical clock technology. A general method is to stabilize the laser frequency to a precisely designed passive optical cavity (high-precision Fabry-Perot interferometer), so as to achieve a more accurate resonance frequency, thereby resulting in a highly coherent optical frequency standard signal. In general, in order to achieve an accurate resonance, the laser frequency must be strictly stabilized to a resonance frequency of an ultra-stable optical cavity. A commonly used method is the Pound-Derver-Hall (PDH) frequency stabilized technique.

However, in this way, firstly, cavity mirrors with higher reflectivity coating is needed, which is difficult in processing; secondly, it is necessary to ensure that the resonance frequency of the cavity is stable, and is immune to the noise affecting the resonance frequency, which results in a high system difficulty and complexity.

SUMMARY

In view of the above mentioned problems, the present disclosure provides a dark cavity laser.

The present disclosure provides a dark cavity laser, including: a frequency stabilized laser output device and a dark cavity laser device;

where the frequency stabilized laser output device is configured to generate a laser light, and perform a frequency stabilized processing on the generated laser light to output it to the dark cavity laser device as a pump light of a gain medium of a dark cavity; and the dark cavity laser device includes a main cavity, and a cavity of the main cavity is provided inside with a gas chamber of a gain medium of a dark cavity laser light, where the gain medium of the dark cavity laser light is alkali metal atoms; the dark cavity laser device is configured to receive the pump light, and form a polyatomic coherent stimulated radiation between transition levels of the alkali metal atoms in the gas chamber by a weak feedback of the main cavity to output the dark cavity laser light.

In other optional examples, the cavity of the main cavity further includes inside: a piezoelectric ceramic with a large displacement configured to adjust a cavity length of the main cavity to change a cavity mode frequency of the main cavity, a first cavity mirror and a second cavity mirror of the main cavity;

where the pump light passes through the piezoelectric ceramic with a large displacement and the first cavity mirror to enter the gas chamber, and is resonated with the alkali metal atoms in the gas chamber to output the generated dark cavity laser light from the second cavity mirror.

In other optional examples, the cavity of the main cavity is further successively provided outside with a heating and heat preservation apparatus configured to heat the main cavity and control a temperature of the main cavity, and a magnetic shielding apparatus configured to reduce an effect of an external magnetic field fluctuation on the alkali metal atoms.

In other optional examples, the frequency stabilized laser output device includes:

a pump laser source configured to generate the laser light;

a driving circuit of the pump laser source configured to drive the pump laser source to output the laser light;

an optical isolator for preventing optical feedback, configured to receive the laser light and output the isolated laser light;

a first half wave plate and a first polarization beam splitting prism configured to adjust intensities of a transmitted light and a reflected light of the isolated laser light, and output the adjusted transmitted light as the pump light of the gain medium of the dark cavity to the dark cavity laser device, and output the adjusted reflected light to a modulated transfer spectrum frequency stabilizer through a reflecting mirror;

the modulated transfer spectrum frequency stabilizer configured to modulate and demodulate the adjusted reflected light, obtain a modulated transfer spectrum signal, and output the modulated transfer spectrum signal to a servo feedback circuit; and the servo feedback circuit, configured to control the pump laser source according to the modulated transfer spectrum signal, so that a laser frequency generated by the pump laser source is locked to a transition spectral line of the alkali metal atoms.

Specifically, the transition spectral line of the alkali metal atoms may be a transition spectral line corresponding to alkali metal atoms such as cesium, rubidium or potassium.

In other optional examples, the gas chamber is filled with pure cesium atoms, or the gas chamber is filled with rubidium atoms and buffer gas.

In other optional examples, the buffer gas is an inert gas.

In other optional examples, when the gas chamber is filled with the pure cesium atoms, the transition spectral line of the alkali metal atoms where the laser frequency generated by the pump laser source is locked to is a transition spectral line of a cesium 455 nm or 459 nm.

In other optional examples, the driving circuit of the pump laser source is further configured to change a driving voltage of the piezoelectric ceramic with a large displacement to change the cavity mode frequency of the main cavity.

In other optional examples, a length change of the piezoelectric ceramic with a large displacement is greater than half of a wavelength of the output dark cavity laser light.

In other optional examples, the main cavity includes single crystal silicon or glass ceramics.

The dark cavity laser provided by the present disclosure includes a frequency stabilized laser output device and a dark cavity laser device; where the frequency stabilized laser output device is configured to generate a laser light, and perform a frequency stabilized processing on the generated laser light to output it to the dark cavity laser device as a pump light of a gain medium of a dark cavity; and the dark cavity laser device includes a main cavity, and a cavity of the main cavity is provided inside with a gas chamber of a gain medium of a dark cavity laser light, where the gain medium of the dark cavity laser light is alkali metal atoms; the dark cavity laser device is configured to receive the pump light, and form a polyatomic coherent stimulated radiation between transition levels of the alkali metal atoms in the gas chamber by a weak feedback of the main cavity to output the dark cavity laser light. The dark cavity laser of the above structure, when adopted, can generate the dark cavity laser light that works in a complete non-resonance region of the main cavity, the generated dark cavity laser light has a narrower output linewidth than a laser light in a resonance region, a gain medium of the generated dark cavity laser light has a zero radiative shift, and the gain medium is alkali metal atoms, and can be used as the active optical clock applied in an atomic clock system.

BRIEF DESCRIPTION OF DRAWINGS

Accompanying drawings herein are incorporated into the specification and form a part of the specification, show examples consistent with the present disclosure, and are used together with the specification to explain principles of the present disclosure.

Figure 1:
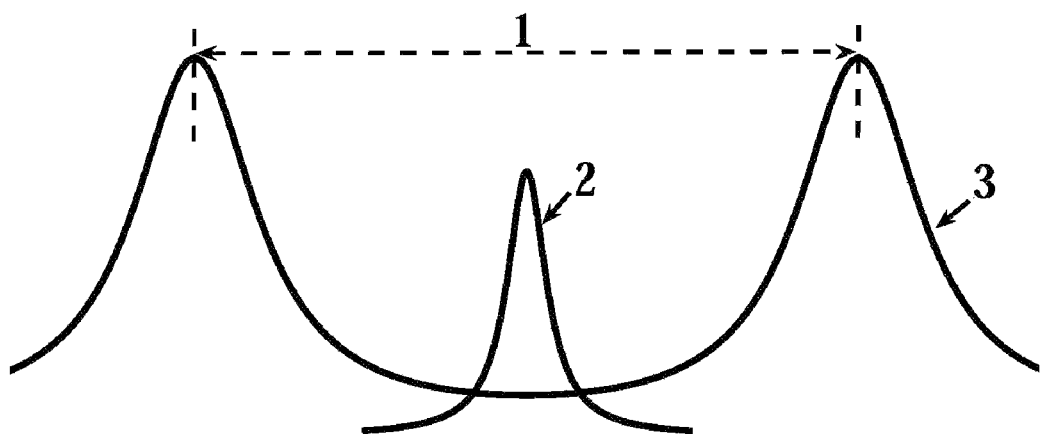
FIG. 1 is a schematic diagram of an operating principle of a dark cavity laser light according to an example of the present disclosure.

Through the above figures, a clear example of the present disclosure has been shown, which will be described in more detail below. The drawings and the written description are not intended to limit the scope of the present disclosure in any way, but to explain concepts of the present disclosure for those skilled in the art by referring to a specific example.

DESCRIPTION OF EMBODIMENTS

Illustrative examples will be described in detail herein, examples of which are illustrated in the accompanying drawings. When the following description refers to the accompanying drawings, same number in different figures represents same or similar elements, unless otherwise indicated. The examples described in the following illustrative examples do not represent all examples consistent with the present disclosure. Instead, they are merely examples of devices and methods consistent with aspects of the present disclosure as detailed in the appended claims.

Various examples of the present disclosure will be described below with reference to the drawings. Accordingly, those of ordinary skill in the art will recognize that various changes, equivalents, and/or substitutions may be made to the various examples described herein without departing from the scope and spirit of the present disclosure. In the description of the figures, similar components may be referred to by similar reference signs.

In the present disclosure, the expressions "having", "may have", "including" and "comprising", or "may include" and "may comprise" may be used herein to indicate the presence of corresponding features (e.g., elements such as numerical values, functions, operations, components, etc.), but do not preclude the presence of additional features.

In the present disclosure, the expressions "A or B", "at least one of A and/or B", or "one or more of A and/or B" used herein may include all combinations of one or more of the related items listed. For example, the terms "A or B", "at least one of A and B", "at least one of A or B" may refer to all of the following: (1) including at least one A, (2) including at least one B, (3) including at least one A and at least one B.

The terms used in the present disclosure are for the purpose of describing the examples of the present disclosure, and are not intended to limit the scope of the present disclosure. Unless otherwise indicated, a term in singular form may include that in plural form. Unless otherwise defined herein, all terms (including technical or scientific terms) used herein may have the same meaning as commonly understood by those skilled in the art. It is also to be understood that the terms defined or commonly used in a lexicon should also be interpreted as a customary means in the related art, and should not be idealized or overly formalized unless explicitly defined as such in the examples of the present disclosure. In some instances, even if a term is a term defined in the present disclosure, the term should not be construed as excluding the examples of the present disclosure.

As the most sophisticated scientific instrument and equipment capable of outputting quantum frequency standards, an atomic clock plays an important role when applied to a field such as promoting redefinition of time second, satellite navigation and positioning, precision scientific measurement, and physical theory (time delay effect in Einstein's theory of relativity) verification, volcano monitoring, quantum simulation, depth mapping, and gravity measurement. In particular, because an optical clock (optical clock) with an optical frequency transition as a reference spectral line can achieve superior accuracy and stability than a microwave atomic clock with a microwave transition as the reference spectral line, and a rapid popularization of a femtosecond optical comb makes an application of optical frequency standard signal become a reality, research on the optical clock at home and abroad, therefore, has been fierce in recent years, and research results have been continuously updated.

At present, the optical frequency standard is mostly achieved based on a traditional passive optical clock technology. A general method is to stabilize a laser output frequency in a precisely designed passive optical cavity (high-precision Fabry-Perot interferometer), so as to achieve a more accurate resonance frequency, thereby resulting in a highly coherent optical frequency standard signal.

However, in order to obtain the optical frequency standard signal in the above way, the laser frequency must be strictly stabilized to a resonance frequency of an ultra-stable optical cavity. A commonly used method is a Pound-Derver-Hall (PDH) frequency stabilized technique. Firstly, cavity mirrors with high reflectivity coating is needed to achieve a Fabry-Perot (F-P) cavity with a fineness of $10^6$ or a higher magnitude, which greatly increases a processing difficulty. Secondly, it is necessary to ensure that a resonance frequency of the cavity is stable, and is immune to the noise affecting the resonance frequency. In the prior art, single crystal silicon or glass ceramics having an ultra-low thermal expansion coefficient is selected as a cavity material of the optical cavity, and the optical cavity is placed in an ultra-low temperature environment, but these measures cannot fundamentally solve a thermal noise problem of the cavity, but increase a system difficulty and complexity.

In order to overcome the thermal noise problem of the ultra-stable optical cavity in the conventional passive optical clock frequency stabilized technology, a concept of an active optical clock is proposed. The active optical clock forms a polyatomic coherent stimulated radiation of a novel bad cavity laser light between atom transition levels by a weak feedback of the optical cavity having a cavity mode linewidth less than a gain linewidth, which can theoretically realize a laser light with a millihertz quantum limit linewidth. In principle, a weakly coupled cooperative excited behavior between atoms is utilized, and a stimulated radiation of a quantum reference system is utilized to directly output a clock transition signal, whose output linewidth can be much smaller than the linewidth of a laser light output by a conventional laser. At the same time, a center frequency of the laser light is determined by a quantum transition frequency rather than a center frequency of a cavity mode, which can effectively suppress a cavity-pulling effect, so that a laser output frequency is significantly less subjected to the effect of the thermal noise of the cavity, thereby breaking through a thermal noise limit of the conventional passive optical clock with PDH frequency stabilized system.

However, whether it is the conventional passive optical clock or the active optical clock, the output optical frequency standard works in the vicinity of a cavity mode resonance region of the cavity, and there is no output corresponding to the non-resonance region of the cavity mode. The present disclosure defines a dark cavity laser light and its realization condition first time: a gain frequency of the laser medium is located at the exactly center frequency of two adjacent cavity modes, that is, the non-resonance region of the resonant cavity where a cavity feedback is lower, which is a "dark cavity" we define, because an intracavity laser field of the cavity here not only does not form resonance enhancement, but makes the intracavity laser field weaker and darker due to that the phases of reflected light fields of two mirrors on left and right sides of the cavity are basically opposite; the dark cavity laser light also has a cavity mode linewidth, the cavity mode linewidth of the dark cavity laser light (i.e., the non-resonance region of the resonant cavity) is defined as a dark cavity mode linewidth $\Gamma_{dark}$ in the present disclosure, and a sum of the dark cavity mode linewidth $\Gamma_{dark}$ and a cavity mode linewidth of the cavity $\Gamma_{cavity}$ is exactly equal to one free spectral range FSR of the cavity, satisfying $\Gamma_{dark}$=FSR−$\Gamma_{cavity}$; $\Gamma_{dark}$ of the dark cavity laser light is larger than a linewidth of a laser gain medium $\Gamma_{gain}$, that is $\Gamma_{dark}$>$\Gamma_{gain}$; and all laser lights need to satisfy the condition for laser generation: a gain of the dark cavity laser light (non-resonance region of the resonant cavity) is greater than a sum of all losses within the optical cavity.

According to the above definition, an operating principle of the dark cavity laser light is shown in FIG. 1, where 1 is a free spectral range of a cavity, 2 is a cavity mode line shape of the cavity, and 3 is a gain line shape of the non-resonance region of the resonant cavity, that is, a gain line shape of the dark cavity laser light.

Dividing according to a size of the linewidth of the laser gain medium $\Gamma_{gain}$ and a size of the cavity mode linewidth of the cavity $\Gamma_{cavity}$, the dark cavity laser light can similarly operate in the good cavity region as the conventional laser ($\Gamma_{cavity}$≤$\Gamma_{gain}$), or operate in a bad cavity region ($\Gamma_{cavity}$>$\Gamma_{gain}$). The dark cavity laser light operating in the bad cavity region has good noise immunity characteristics to a cavity length change. By changing a cavity mirror reflectivity of the cavity to adjust a ratio of the cavity mode linewidth and the gain linewidth, the dark cavity laser light can be transferred from the bad cavity region to the good cavity region, so that the F-P cavity with high fineness also has a suppressed cavity-pulling characteristic, which solves the high requirements of the current optical cavity with respect to operating condition with extremely low temperature, material with ultra-low thermal expansion coefficient and optical cavity mirrors with ultra-high reflectivity.

Figure 2:
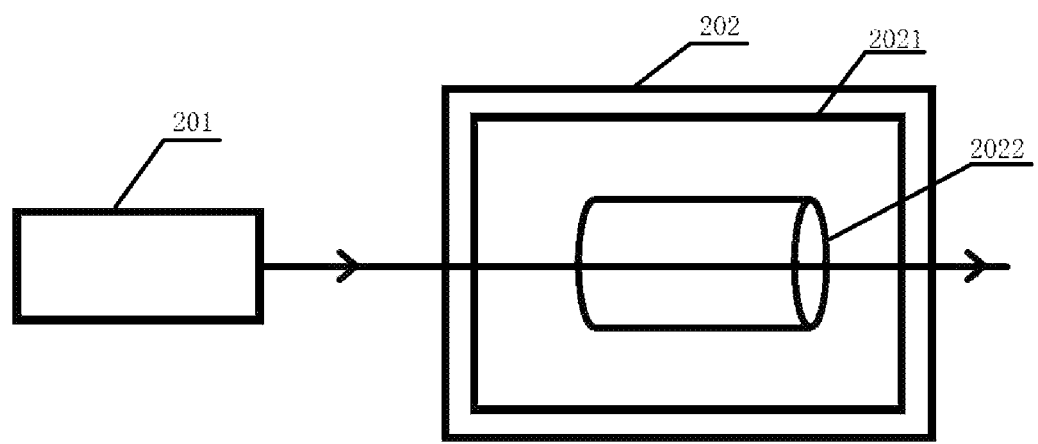
FIG. 2 is a schematic structural diagram of a dark cavity laser according to an example of the present disclosure.

FIG. 2 is a schematic structural diagram of a dark cavity laser according to an example of the present disclosure. As shown in FIG. 2, the dark cavity laser includes a frequency stabilized laser output device 201 and a dark cavity laser device 202.

The frequency stabilized laser output device 201 is configured to generate a laser light, and perform a frequency stabilized processing on the generated laser light to output it to the dark cavity laser device 202 as a pump light of a gain medium of a dark cavity; and the dark cavity laser device 202 includes a main cavity 2021, and a cavity of the main cavity 2021 is provided inside with a gas chamber of a gain medium of a dark cavity laser light 2022, where the gain medium of the dark cavity laser light is alkali metal atoms; the dark cavity laser device 202 is configured to receive the pump light, and form a polyatomic coherent stimulated radiation between transition levels of the alkali metal atoms in the gas chamber 2022 by a weak feedback of the main cavity 2021 to output the dark cavity laser light.

As an optional example, the main cavity 2021 includes single crystal silicon or glass ceramics. Specifically, in order to reduce the change of a cavity length of the main cavity of the dark cavity laser light caused by an external temperature change, a cavity material of the main cavity 2021 is a material having a small thermal expansion coefficient, such as single crystal silicon or glass ceramics. In addition, when designing the coating parameter of the main cavity 2021, the fineness of a cavity of an active optical clock can be extremely low compared to that of an optical cavity of a conventional passive optical clock, so that the laser works in a bad cavity region.

In the present example, the gas chamber 2022 is filled with pure cesium atoms, or the gas chamber 2022 is filled with rubidium atoms and buffer gas. Specifically, the gas chamber 2022 is filled with pure cesium atoms because cesium atoms have a prominent position in the field of metrology, and 1 second is defined as a duration of 919,731,770 cycles of the atomic transition between two hyperfine levels of the ground state of 133 cesium atoms without disturbing, that is, a cesium atomic clock is a time reference, and second, minute, and hour used in life or scientific research are traced back to this basic time unit. Of course, the gas chamber 2022 may be filled with one of rubidium, potassium and sodium in addition to the pure cesium atoms, and the buffer gas adopts an inert gas such as argon, krypton or xenon.

In this example, the gas chamber 2022 may be a glass cell, where the glass cell is a cylindrical housing with both ends being flat, and does not cause deformation of a laser light spot.

Correspondingly, when the gas chamber 2022 is filled with pure cesium atoms, a transition spectral line of the alkali metal atoms where a laser frequency of the frequency stabilized laser output device 201 is locked to is a transition spectral line of a cesium 455 nm or 459 nm. As the gain medium of the dark cavity, the pure cesium atoms form a polyatomic coherent stimulated radiation between transition levels of the alkali metal atoms by the weak feedback of the main cavity, and outputs the dark cavity laser light.

The dark cavity laser provided by the present disclosure includes a frequency stabilized laser output device and a dark cavity laser device; where the frequency stabilized laser output device is configured to generate a laser, and perform a frequency stabilized processing on the generated laser to output it to the dark cavity laser device as a pump light of a gain medium of a dark cavity; and the dark cavity laser device includes a main cavity, and a cavity of the main cavity is provided inside with a gas chamber of a gain medium of a dark cavity laser light, where the gain medium of the dark cavity laser light is alkali metal atoms; the dark cavity laser device is configured to receive the pump light, and forms a polyatomic coherent stimulated radiation between transition levels of the alkali metal atoms in the gas chamber by a weak feedback of the main cavity to output the dark cavity laser. The dark cavity laser of the above structure, when adopted, can generate a dark cavity laser that works in a complete non-resonance region of the main cavity, and the generated dark cavity laser has a narrower output linewidth than a laser in a resonance region, a gain medium of the generated dark cavity laser light has a zero radiative shift, and the gain medium is alkali metal atoms, and can be used as the active optical clock applied in an atomic clock system.

Figure 3:
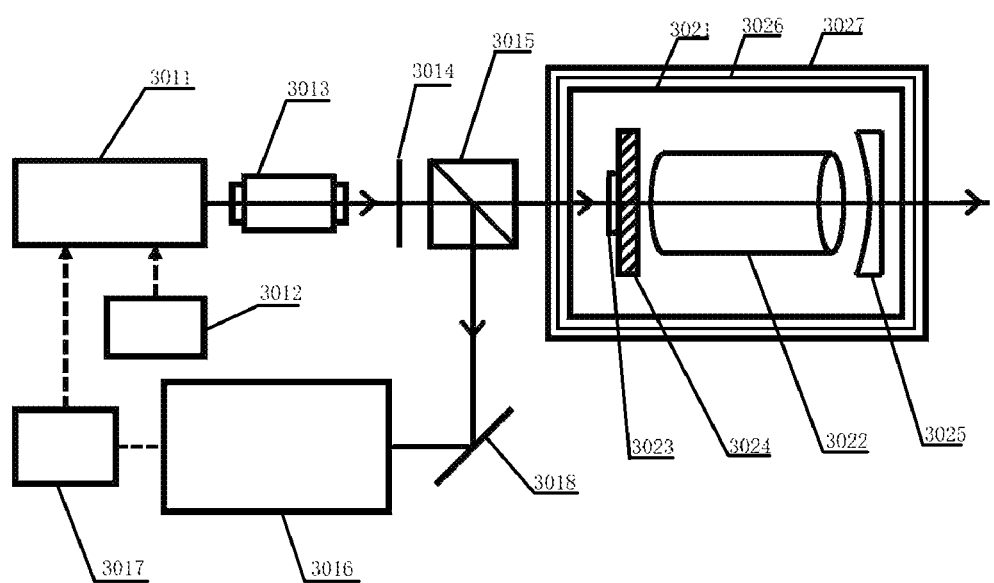
FIG. 3 is a schematic structural diagram of a dark cavity laser according to another example of the present disclosure.

FIG. 3 is a schematic structural diagram of a dark cavity laser according to another example of the present disclosure. As shown in FIG. 3, the dark cavity laser 30 includes a frequency stabilized laser output device 301 and a dark cavity laser device 302. The dark cavity laser device 302 includes a main cavity 3021, and a cavity of the main cavity 3021 is provided inside with a gas chamber of a gain medium of a dark cavity laser light 3022, where the gain medium of the dark cavity laser light is alkali metal atoms.

The frequency stabilized laser output device 301 includes: a pump laser source 3011, a driving circuit of the pump laser source 3012, an optical isolator 3013 for preventing optical feedback, a first half wave plate 3014, a first polarization beam splitting prism 3015, a modulated transfer spectrum frequency stabilizer 3016 and a servo feedback circuit 3017.

In the example, the pump laser source 3011 is used to generate a laser light; an ultra-narrow linewidth interference filter configuration external cavity diode laser can be adopted.

The driving circuit of the pump laser source 3012 is configured to drive the pump laser source 3011 to output the laser light; the driving circuit of the pump laser source 3012 controls operating temperature and current of the laser source 3011.

The optical isolator 3013 is configured to receive the laser light and output the isolated laser light.

The first half wave plate 3014 and the first polarization beam splitting prism 3015 are configured to adjust intensities of a transmitted light and a reflected light of the isolated laser light, and output the adjusted transmitted light as a pump light of a gain medium of a dark cavity to the dark cavity laser device 202, and output the adjusted reflected light to the modulated transfer spectrum frequency stabilizer 3016 through a reflecting mirror 3018.

The modulated transfer spectrum frequency stabilizer 3016 is configured to modulate and demodulate the adjusted reflected light, obtain a modulated transfer spectrum signal, and output the modulated transfer spectrum signal to the servo feedback circuit 3017.

The servo feedback circuit 3017 is configured to control the pump laser source 3011 according to the modulated transfer spectrum signal, so that a laser frequency generated by the pump laser source 3011 is locked to a transition spectral line of the alkali metal atoms.

Specifically, the transition spectral line of the alkali metal atoms may be a transition spectral line corresponding to alkali metal atoms such as cesium, rubidium or potassium.

In the example, the driving circuit of the pump laser source 3012 drives the pump laser source 3011 to output the laser light, which first passes through the optical isolator 3013 to prevent optical feedback, and then passes through the first half wave plate 3014 and the first polarization beam splitting prism 3015. By rotating an angle between the first half wave plate 3014 and the first polarization beam splitting prism 3015, the intensities of the transmitted light and the reflected light are adjusted, and the strong transmitted light is used for the pure cesium atoms in the main cavity 3021 to output the dark cavity laser light, and the weak reflected light is input to the modulated transfer spectrum frequency stabilizer 3016 to obtain the high performance modulated transfer spectrum signal, and the modulated transfer spectrum signal is fed back to the pump laser source 3011 through the servo feedback circuit 3017, so that the laser frequency output by the pump laser source 3011 is locked to the transition spectral line of the cesium 455 nm or 459 nm. Further, when an output wavelength of the laser light output by the pump laser source 3011 is 455 nm, the laser frequency generated by the pump laser source 3011 is locked by the servo feedback circuit 3017 to a transition spectral line of the cesium atoms from a ground state $6S_{1/2}$ to a second excited state $7P_{3/2}$; when the output wavelength of the laser light output by pump laser source 3011 is 459 nm, the laser frequency generated by the pump laser source 3011 is locked by the servo feedback circuit 3017 to a transition spectral line of the cesium atoms from a ground state $6S_{1/2}$ to a second excited state $7P_{1/2}$. By the above way, a frequency stabilization of the pump source laser light of the dark cavity laser active optical clock is realized.

As a further optional example, the cavity of the main cavity 3021 further includes inside: a piezoelectric ceramic with a large displacement 3023 configured to adjust a cavity length of the main cavity 3021 to change a cavity mode frequency of the main cavity 3021, a first cavity mirror 3024 and a second cavity mirror 3025 of the main cavity 3021.

The pump light passes through the piezoelectric ceramic with a large displacement 3023 and the first cavity mirror 3024 to enter the gas chamber 3022, and is resonated with the alkali metal atoms in the gas chamber 3022 to output the generated dark cavity laser light from the second cavity mirror 3025.

In the example, a length change of the piezoelectric ceramic with a large displacement 3023 should be as large as possible to meet a requirement that a change amount of the cavity mode frequency of the dark cavity laser is greater than a free spectral range FSR. As an alternative example, the length change of the piezoelectric ceramic with a large displacement is greater than half of a wavelength of the output dark cavity laser light. Further, a change amount of the length change of the piezoelectric ceramic with a large displacement can be greater than 0.735 micron.

In this example, the first cavity mirror 3024 can be set as a plane mirror, the second cavity mirror 3025 can be set as a plane-concave mirror; and the first cavity mirror 3024 and the second cavity mirror 3025 can be embedded in the integrated main cavity 3021 to increase a mechanical stability of the cavity.

As another alternative embodiment, the driving circuit of the pump laser source 3012 is further configured to change a driving voltage of the piezoelectric ceramic with a large displacement 3023 to change the cavity mode frequency of the main cavity 3021.

As another alternative example, the cavity of the main cavity 3021 is further provided successively outside with a heating and heat preservation apparatus 3026 configured to heat the main cavity 3021 and control a temperature of the main cavity 3021, and a magnetic shielding apparatus 3027 configured to reduce an effect of an external magnetic field fluctuation on the alkali metal atoms.

In the example, the heating and heat preservation apparatus 3026 is provided outside the cavity of the main cavity 3021 to stabilize a temperature of the cesium atoms at 90° C.±0.01° C., thereby reducing a frequency shift and broadening caused by collision of atoms and atoms and collision of atoms and the atomic gas chamber. The magnetic shielding apparatus 3027 is disposed outside the heating and heat preservation apparatus 3026 to reduce a Zeeman shift and broadening caused by the external magnetic field fluctuation. The magnetic shielding apparatus 3027 can be a boxed structure, and the main cavity 3021 is placed in the box. The magnetic shielding apparatus 3027 can be made of three layers of permalloy.

The operating principle of the example is that: the gain medium of the dark cavity laser light, that is, the alkali metal atoms placed in the glass bubble chamber, works in a non-resonance region of the resonant cavity where a cavity feedback is lower, which can be satisfied by adjusting the piezoelectric ceramic with a large displacement to make an atomic transition frequency near the exactly center frequency of two adjacent cavity modes, thereby conforming to a "dark cavity" defined by the present disclosure, because at this cavity mode frequency, a stimulated radiation field of the gain atoms in the cavity not only does not form resonance enhancement, but also an stimulated radiation field of gain atoms of an in-cavity dark cavity laser is made weaker and darker because that phases of reflected light fields of two mirrors on left and right sides of the cavity are basically inverted. Similarly, according to the definition of the dark cavity laser light of the present disclosure, the first and second cavity mirrors of the main cavity form a "dark cavity" of the dark cavity laser light. A sum of a cavity mode linewidth of the dark cavity laser light (i.e., the non-resonance region of the resonant cavity), that is a dark cavity mode linewidth $\Gamma_{dark}$, and a cavity mode linewidth of the cavity $\Gamma_{cavity}$ is exactly equal to one free spectral range FSR of the cavity, i.e., satisfying $\Gamma_{dark}$=FSR−$\Gamma_{cavity}$. Specifically, the dark cavity mode linewidth $\Gamma_{dark}$ should be larger than again linewidth $\Gamma_{gain}$ of the atoms placed in the glass bubble chamber as the gain medium of the dark cavity laser light, that is $\Gamma_{dark}$>$\Gamma_{gain}$. Finally, a gain of the dark cavity laser light (non-resonance region of the resonant cavity) is greater than a sum of all losses within the optical cavity, that is, the condition for laser generation of the stimulated radiation is satisfied.

The implementation of the example is as follows:

1) a glass bubble is filled with alkali metal atoms or alkali metal atoms and buffer gas as a gain medium of a dark cavity laser light, the glass bubble is placed within a main cavity, and the main cavity is heated and a temperature thereof is controlled outside through a heating and heat preservation apparatus, a magnetic shielding apparatus is placed on the outermost layer to isolate an effect of an external magnetic field fluctuation on the gain medium;

2) a driving circuit of a pump laser source drives a pump laser source to output a laser light, which first passes through an optical isolator to prevent optical feedback, and then passes through a first half wave plate and a first polarization beam splitting prism. Rotation of an angle between the first half wave plate and the first polarization beam splitting prism can adjust intensities of a transmitted light and a reflected light. The strong transmitted light is used as a pump light of the gain medium of the dark cavity laser light, and the weak reflected light is input into a modulated transfer spectrum frequency stabilizer to obtain a high performance modulated transfer spectrum signal. The modulated transfer spectrum signal is fed back to a controller and laser head of the laser through a servo feedback circuit to lock a laser frequency of the laser in a transition spectral line of the atoms. The above steps achieve a frequency stabilization of the pump light of the dark cavity laser.

3) the transmitted light passing through the first polarization beam splitting prism is frequency stabilized by the modulated transfer spectrum in step 2). Next, the transmitted light stimulates the alkali metal atoms, that is the gain medium of the dark cavity laser light, then forms a polyatomic coherent stimulated radiation between transition levels of the alkali metal atoms by a weak feedback of the main cavity, and outputs the dark cavity laser light.

In order to realize the output of the dark cavity laser light, an atomic number density can be increased to heat the alkali metal atoms, and a heating temperature is determined according to a power of the output dark cavity laser light. Generally, a temperature point with the largest output power is selected and the temperature is controlled.

The dark cavity laser provided by the present disclosure includes a frequency stabilized laser output device and a dark cavity laser device; where the frequency stabilized laser output device includes: a pump laser source configured to generate the laser light; a driving circuit of the pump laser source configured to drive the pump laser source to output the laser light; an optical isolator for preventing optical feedback, configured to receive the laser light and output the isolated laser light; a first half wave plate and a first polarization beam splitting prism configured to configured to adjust intensities of a transmitted light and a reflected light of the isolated laser light, and output the adjusted transmitted light as a pump light of a gain medium of a dark cavity to the dark cavity laser device, and output the adjusted reflected light to the modulated transfer spectrum frequency stabilizer through a reflecting mirror;

the modulated transfer spectrum frequency stabilizer, configured to modulate and demodulate the adjusted reflected light, obtain a modulated transfer spectrum signal, and output the modulated transfer spectrum signal to the servo feedback circuit; and the servo feedback circuit, configured to control the pump laser source according to the modulated transfer spectrum signal, so that a laser frequency generated by the pump laser source is locked to a transition spectral line of alkali metal atoms. The transition spectral line of the alkali metal atoms may specifically be a transition spectral line corresponding to alkali metal atoms such as cesium, rubidium or potassium.

The cavity of the main cavity further includes inside: a piezoelectric ceramic with a large displacement configured to adjust a cavity length of the main cavity to change a cavity mode frequency of the main cavity, a first cavity mirror and a second cavity mirror of the main cavity. The pump light passes through the piezoelectric ceramic with a large displacement and the first cavity mirror to enter the gas chamber, and is resonated with the alkali metal atoms in the gas chamber to output the generated dark cavity laser light from the second cavity mirror. The cavity of the main cavity is further provided successively outside with a heating and heat preservation apparatus configured to heat the main cavity and control a temperature of the main cavity, and a magnetic shielding apparatus configured to reduce an effect of an external magnetic field fluctuation on the alkali metal atoms. The dark cavity laser of the above structure, when adopted, can generate the dark cavity laser light that works in a complete non-resonance region of the main cavity, the generated dark cavity laser light has a narrower output linewidth than a laser light in a resonance region, a gain medium of the generated dark cavity laser light has a zero radiative shift, and the gain medium is alkali metal atoms, and can be used as the active optical clock applied in an atomic clock system.

Optionally, in some scenarios, a power of the output dark cavity laser light needs to be calibrated. As an optional embodiment, the present disclosure further includes a second half wave plate, a second polarization beam splitting prism, and a photodetector. By changing the driving voltage of the piezoelectric ceramic with a large displacement, or adding a modulation signal to a controller of the piezoelectric ceramic with a large displacement, a cavity length of the main cavity of the dark cavity laser light is adjusted, thereby changing the cavity mode frequency of the main cavity, and the power of the output dark cavity laser light is recorded at different cavity mode frequencies. After the dark cavity laser light passes through the second half wave plate and the second polarization beam splitting prism, a transmitted light is incident on the photodetector, and a voltage value on the photodetector is converted into a power value of the dark cavity laser light to calibrate the power.

A change range of the cavity mode frequency must be larger than one free spectral range of the cavity, and a transmissivity of a dark cavity laser light intensity of the main cavity is fitted and compared with an Airy function describing an F-P cavity transmissivity to calibrate a resonance region and a non-resonance region of the main cavity. The laser operating in the non-resonance region of the main cavity is the dark cavity laser light.

Optionally, in some scenarios, it is desirable to select the best operating condition for the dark cavity laser light. Output powers of the dark cavity laser light at different cavity mode frequencies are measured at different pump light powers and different gain atomic densities, so as to study the laser characteristic operating in the resonance region and the non-resonance region, and thereby select the best operating condition for the dark cavity laser light.

When the best operating condition for the dark cavity laser light is determined, the dark cavity laser light is reflected by a dichroic mirror, and the remaining pump laser light after passing through the main cavity is transmitted by the dichroic mirror, and the dark cavity laser light is reflected by the dichroic mirror. The cavity mode frequency is changed by changing the cavity length of the main cavity of the dark cavity laser light to measure the suppressed cavity-pulling coefficient of the active optical clock for the dark cavity laser light at different cavity mode frequencies, thereby proving that the dark cavity laser light has the suppressed cavity-pulling advantage compared with a conventional good cavity laser light.

The dark cavity laser light and a laser light from a reference narrow linewidth laser system used for testing performance are combined and beat in a beat frequency tester. The cavity mode frequency is changed by changing the cavity length of the main cavity of the dark cavity laser light to measure a beating linewidth in different cavity mode frequencies, thereby obtaining a linewidth of the dark cavity laser light at different cavity mode frequencies. The laser linewidth in the resonance region and the non-resonance region are compared with each other to prove that the linewidth of the dark cavity laser light in the non-resonance region does not have an obvious broadening compared with that in the resonance region.

The ratio of the cavity mode linewidth and the atomic gain linewidth is changed by changing a reflectivity of the cavity mirrors and the cavity length of the main cavity of the dark cavity laser light, so as to transfer the dark cavity laser light operating in the bad cavity region achieved by the above steps to the good cavity region. Research of the suppressed cavity-pulling characteristic of dark cavity laser light is made in the non-resonant region corresponding to the good cavity range whose laser gain linewidth is bigger than cavity mode linewidth.

Although the illustrative examples of the present disclosure are described herein, the present disclosure is not limited to the various preferred examples described herein, but includes any and all examples, modification, omitting, combination (e.g., aspects of all of the various examples), change and/or replacement having equivalent elements that will be understood by those skilled in the art in light of the present disclosure. The limitations in the claims are to be interpreted broadly in accordance with the terms adopted in the claims and are not intended to be limited to the examples described in the specification or during the process of the present application, and the examples are interpreted as non-exclusive. For example, in the present disclosure, the term "preferably" is non-exclusive, which means "preferably, but not limited to." In the present disclosure and during the process of the present application, the limitations of apparatus plus function or step plus function will only be used in the case where, for the specific claim limitation, all of the following conditions exist in the limitation: a) clearly stated "apparatus for" or "step for"; b) clearly states the corresponding function; and c) does not state the structure, material or behavior supporting the structure. In the present disclosure and during the process of the present application, the term "the present disclosure" or "disclosure" may be used to denote one or more aspects of the present disclosure. The term of the present disclosure or the present disclosure should not be interpreted as a limitation, and should not be incorrectly interpreted as being applied to all aspects or examples (i.e., it should be understood that the present disclosure has various aspects and examples) and should not be incorrectly interpreted as limiting the scope of the application or claim. In the present disclosure and during the process of the present application, the term "example" may be used to describe any aspect, feature, process or step, any combination thereof, and/or any portion thereof, and the like. In some examples, various examples may include overlapping features. In the present disclosure and during the process of the present application, the following abbreviated terms may be utilized: "e.g." indicating "for example" and "NB" indicating "notice".

It should be noted that the above examples are only for explaining the technical solutions of the present disclosure, and are not limited thereto; although the present disclosure has been described in detail with reference to the foregoing examples, those skilled in the art will understand that they can still modify the technical solutions described in the foregoing examples, or make equivalent substitution to some or all of the technical features; and such modifications or substitutions do not deviate the corresponding technical solutions from the scope of the technical solutions of the example of the present disclosure.

What is claimed is:

1. A dark cavity laser, comprising: a frequency stabilized laser output device and a dark cavity laser device;
   wherein the frequency stabilized laser output device is configured to generate a laser light, and perform a frequency stabilized processing on the generated laser light to output it to the dark cavity laser device as a pump light of a gain medium of a dark cavity; and
   the dark cavity laser device includes a main cavity, and a cavity of the main cavity is provided inside with a gas chamber of a gain medium of a dark cavity laser light, wherein the gain medium of the dark cavity laser light is alkali metal atoms; the dark cavity laser device is configured to receive the pump light, and form a polyatomic coherent stimulated radiation between transition levels of the alkali metal atoms in the gas chamber by a weak feedback of the main cavity to output the dark cavity laser light;
   wherein the dark cavity is a complete non-resonance region of the main cavity, and a transition frequency of the alkali metal atoms in the gas chamber is located at an exactly center frequency of two adjacent cavity modes.

2. The dark cavity laser according to claim 1, wherein the cavity of the main cavity further comprises inside: a piezoelectric ceramic with a large displacement configured to adjust a cavity length of the main cavity to change a cavity mode frequency of the main cavity, a first cavity mirror and a second cavity mirror of the main cavity;
   wherein the pump light passes through the piezoelectric ceramic with a large displacement and the first cavity mirror to enter the gas chamber, and is resonated with the alkali metal atoms in the gas chamber to output the generated dark cavity laser light from the second cavity mirror.

3. The dark cavity laser according to claim 2, wherein the cavity of the main cavity is further successively provided outside with a heating and heat preservation apparatus configured to heat the main cavity and control a temperature of the main cavity, and a magnetic shielding apparatus configured to reduce an effect of an external magnetic field fluctuation on the alkali metal atoms.

4. The dark cavity laser according to claim 2, wherein the frequency stabilized laser output device comprises:
   a pump laser source configured to generate the laser light;
   a driving circuit of the pump laser source configured to drive the pump laser source to output the laser light;
   an optical isolator for preventing optical feedback, configured to receive the laser light and output the isolated laser light;
   a first half wave plate and a first polarization beam splitting prism configured to adjust intensities of a transmitted light and a reflected light of the isolated laser light, and output the adjusted transmitted light as the pump light of the gain medium of the dark cavity to the dark cavity laser device, and output the adjusted reflected light to a modulated transfer spectrum frequency stabilizer through a reflecting mirror;
   the modulated transfer spectrum frequency stabilizer configured to modulate and demodulate the adjusted reflected light, obtain a modulated transfer spectrum signal, and output the modulated transfer spectrum signal to a servo feedback circuit; and
   the servo feedback circuit, configured to control the pump laser source according to the modulated transfer spectrum signal, so that a laser frequency generated by the pump laser source is locked to a transition spectral line of the alkali metal atoms.

5. The dark cavity laser according to claim 4, wherein the gas chamber is filled with pure cesium atoms, or the gas chamber is filled with rubidium atoms and buffer gas.

6. The dark cavity laser according to claim 5, wherein the buffer gas is inert gas.

7. The dark cavity laser according to claim 5, wherein when the gas chamber is filled with the pure cesium atoms, the transition spectral line of the alkali metal atoms where the laser frequency generated by the pump laser source is locked to is a transition spectral line of a cesium 455 nm or 459 nm.

8. The dark cavity laser according to claim 4, wherein the driving circuit of the pump laser source is further configured to change a driving voltage of the piezoelectric ceramic with a large displacement to change the cavity mode frequency of the main cavity.

9. The dark cavity laser according to claim 2, wherein a length change of the piezoelectric ceramic with a large displacement is greater than half of a wavelength of the output dark cavity laser light.

10. The dark cavity laser according to claim 1, wherein the main cavity comprises single crystal silicon or glass ceramics.

* * * * *